US005457353A

United States Patent [19]

Thurn et al.

[11] Patent Number: 5,457,353

[45] Date of Patent: Oct. 10, 1995

[54] FREQUENCY-SELECTIVE ULTRASONIC SANDWICH TRANSDUCER

[75] Inventors: Rudolf Thurn, Kemnath; Hans-Joachim Burger, Kümmersbruck, both of Germany

[73] Assignee: Siemens Aktiengesellschaft, München, Germany

[21] Appl. No.: 301,521

[22] Filed: Sep. 7, 1994

Related U.S. Application Data

[63] Continuation of Ser. No. 192,314, Feb. 4, 1994, abandoned, which is a continuation of Ser. No. 952,485, Sep. 28, 1992, abandoned, which is a continuation of Ser. No. 681,787, Apr. 1, 1991, abandoned.

[30] Foreign Application Priority Data

Apr. 9, 1990 [EP] European Pat. Off. .............. 90106773

[51] Int. Cl.[6] .............................................. H01L 41/08

[52] U.S. Cl. .......................... 310/334; 310/327; 310/340; 310/345

[58] Field of Search .................................... 310/321–324, 310/327, 334, 340, 345

[56] References Cited

U.S. PATENT DOCUMENTS

| | | | |
|---|---|---|---|
| 3,191,913 | 6/1965 | Mettler | 310/334 |
| 3,457,463 | 7/1969 | Balamuth | 310/321 X |
| 3,484,741 | 12/1969 | Hyman | 310/322 X |
| 3,846,779 | 11/1974 | Martner | 310/321 X |
| 3,861,773 | 6/1974 | Baldwin et al. | 310/321 X |
| 3,863,250 | 1/1975 | McCluskey, Jr. | 310/319 X |
| 3,939,467 | 2/1976 | Cook et al. | 310/334 X |
| 4,048,454 | 9/1977 | Barcus et al. | 310/322 X |
| 4,072,936 | 2/1978 | Spirig | 310/324 |
| 4,114,063 | 9/1978 | Nelkin et al. | 310/334 |
| 4,166,967 | 9/1979 | Benes et al. | 310/334 X |
| 4,282,453 | 8/1981 | Knight et al. | 310/334 X |
| 4,326,274 | 4/1982 | Hotta et al. | 310/326 |
| 4,413,331 | 11/1983 | Rowe, Jr. et al. | 310/334 X |
| 4,494,032 | 1/1985 | Martin | 310/324 |
| 4,536,673 | 8/1985 | Forster | 310/324 |
| 4,571,520 | 2/1986 | Saito et al. | 310/334 |
| 4,656,384 | 4/1987 | Magori | 310/340 X |
| 4,677,337 | 6/1987 | Kleinschmidt et al. | 310/334 |
| 4,771,205 | 9/1988 | Meguio | 310/334 |
| 4,837,558 | 6/1989 | Abel et al. | 310/324 X |
| 4,963,782 | 10/1990 | Bui et al. | 310/334 X |
| 5,196,755 | 3/1993 | Shields | 310/324 |

FOREIGN PATENT DOCUMENTS

| | | |
|---|---|---|
| 0104457 | 4/1984 | European Pat. Off. . |
| 0128049 | 12/1984 | European Pat. Off. . |
| 0154706 | 9/1985 | European Pat. Off. . |
| 2842086 | 4/1980 | Germany . |
| 3446183 | 6/1986 | Germany . |

*Primary Examiner*—Mark O. Budd
*Attorney, Agent, or Firm*—Kenyon & Kenyon

[57] ABSTRACT

For certain applications, such as detecting of glass breakage, it is advantageous to use frequency-selective ultrasonic transducers. In this case, one can dispense with using costly filter configurations to filter out relevant frequency components of the received ultrasonic spectrum. An ultrasonic sandwich transducer, which shows a high sensitivity for certain predetermined frequencies, can be produced by selectively adapting at least one of its geometric dimensions to the frequency selectivity which is required of the transducer. The ultrasonic sandwich transducer preferably has a piezoelectric-ceramic wafer, which is surrounded on at least one of its two wafer surfaces by a layer of low acoustical impedance. The piezoelectric-ceramic wafer is effectively rectangular, resulting in a block-shaped member. One of the dimensions of height, length and width is fixed to correspond to a desired fundamental frequency.

5 Claims, 1 Drawing Sheet

FREQUENCY-SELECTIVE ULTRASONIC SANDWICH TRANSDUCER

This is a continuation of application Ser. No. 08/192,314 filed Feb. 4, 1994 now abandoned, which is a continuation of application Ser. No. 07/952,485 filed Sep. 28, 1992 now abandoned, which is a continuation of application Ser. No. 07/681,787 filed on Apr. 1, 1991, now abandoned.

BACKGROUND OF THE INVENTION

The invention relates generally to ultrasonic sandwich transducers, and more particularly to such an ultrasonic sandwich transducer that is frequency selective.

Ultrasonic sandwich transducers known to date are wide-band short-distance transducers, as disclosed in U.S. Pat. No. 4,677,337 (EP O 154 706 A2) or EP 0 128 049, or as wide-angle proximity sensors. These transducers have high mechanical damping, i.e. low sensitivity, and are relatively expensive due to high material and production costs. Another disadvantage of previously known ultrasonic sandwich transducers is their narrow pattern directivity for certain frequency ranges. This is undesirable in applications for wide-angle detecting of glass breakage, such as that which occurs in motor vehicles during a break-in. Conventional transducers having a very large bandwidth can be used for this application. When a glass pane breaks, they pick up radiated ultrasonic vibrations and convert them into an electrical signal with frequencies corresponding to the frequencies of vibration. The corresponding frequencies of vibration that are typical when glass breaks make it possible for a glass pane break to be recognized by means of an evaluation circuit following the ultrasonic transducer. In this case, the evaluator must filter the frequencies corresponding to the glass break from the entire spectrum in which the ultrasonic transducer is sensitive. This may be accomplished by using filters since only the signals occurring at the concerned frequencies at break are relevant in determining a glass pane break. To simplify such an evaluation device of a glass break signalling configuration and at the same time to save costs, it would be advantageous to employ an ultrasonic sandwich transducer that is only sensitive to certain frequencies, such as the frequencies that occur when a glass pane breaks. One could then dispense with the filters, which would otherwise be needed in the evaluation circuit, or at least keep the number of filters to a minimum.

The invention is directed to the problem of developing an ultrasonic sandwich transducer that is highly sensitive to certain predetermined frequencies.

SUMMARY OF THE INVENTION

The present invention solves this problem by specifically adapting at least one of the geometric dimensions of the ultrasonic sandwich transducer to the frequency selectivity which is desired of the transducer.

An advantageous refinement of the present invention occurs when the ultrasonic sandwich transducer includes a piezoelectric-ceramic wafer and a layer of low acoustical impedance surrounding one of the surfaces of the piezoelectric-ceramic wafer.

Another advantageous refinement of the present invention occurs when the ultrasonic sandwich transducer is designed as a block, and at least the height, length, or width of the block is selected to correspond to the desired fundamental frequency.

Another advantageous refinement of the present invention occurs when the ultrasonic sandwich transducer includes a piezoelectric-ceramic wafer with a layer of low acoustical impedance surrounding at least one of the surfaces of the piezoelectric-ceramic wafer. In addition, the large outer surface of the piezoelectric-ceramic wafer and the low acoustical impedance layer are surrounded by flexible embedding material which contains filler for damping that is variable in quantity.

Another advantageous refinement of the present invention occurs when the ultrasonic sandwich transducer which has a narrow longitudinal side and a narrow broad side, either of which can be used as a sound-receiving surface, has mechanical damping which can be varied within broad limits by adding filler. Thus, when an additional evaluation of transient processes is desired, the bandwidth of the transducer modes can be selectively and definably enlarged.

A simple design for detecting glass breakage uses an evaluator following the ultrasonic sandwich transducer. This evaluator compares the received ultrasonic spectra to the ultrasonic spectrum that is typical for glass breakage and evaluates these spectra.

Another simplification for the glass-break signalling configuration uses a microprocessor for storing the ultrasonic spectrum that is typical for glass breakage.

DETAILED DESCRIPTION

Figure 1:
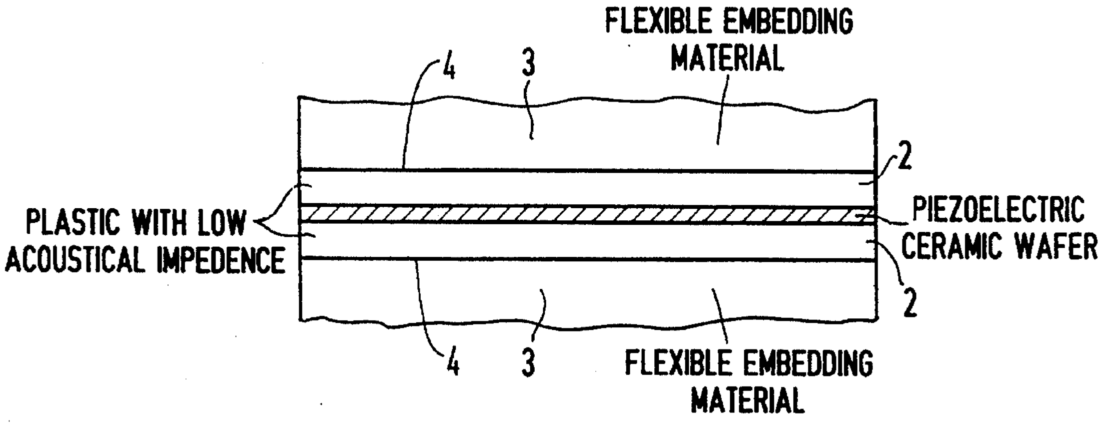
FIG. 1 depicts a cross-section of an ultrasonic sandwich transducer.
Figure 2:
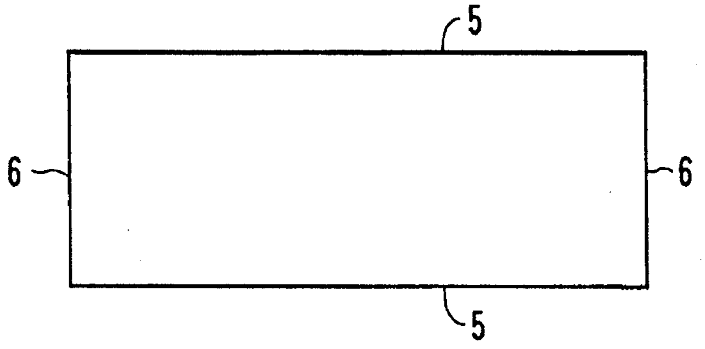
FIG. 2 depicts a plan view of the same ultrasonic sandwich transducer.

FIG. 1 depicts an ultrasonic sandwich transducer with a rectangular piezoelectric-ceramic wafer 1, which is preferably surrounded on both sides by a layer of plastic material 2 of low acoustical impedance. For example, the two plastic layers 2 may consist of epoxy resin filled with hollow-glass spheres. The outer geometric dimensions of the block-shaped ultrasonic sandwich transducer are adjusted so that with the effective sonic velocities of the plastic-ceramic composite, narrow-band resonance points of sensitivity occur at those frequencies at which the characteristic maxima also occur in the glass-breakage spectrum to be evaluated. Thus, the glass-break emission can be advantageously registered in a manner which is selective to frequency and with high sensitivity. The above-mentioned plastic-ceramic composite is surrounded by flexible embedding material 3, which contains fillers for damping that are variable in quantity. This means that by adding the fillers, the mechanical damping of the flexible embedding material 3 can be varied within broad limits. Thus, the band width of the transducer modes can be selectively and definably enlarged, when an additional evaluation of transient processes is desired. The narrow longitudinal side 5 or broadside 6 of the ultrasonic sandwich transducer can be used as a sound-receiving surface. It is kept free of the embedding material 3. For example, the dimensions of such an ultrasonic sandwich transducer can amount to 20×10×2 mm, whereas the piezoelectric-ceramic wafer has dimensions of 20×10×0.2 mm, for example. Such an ultrasonic sandwich transducer has selective receiving sensitivity at 60 and 120 kHz. The narrow longitudinal side is used as a sound-receiving surface. The wide part of the astigmatic directivity pattern in this case is greater than 120° at both frequencies.

For example, this ultrasonic sandwich transducer is suited for application in a glass-breakage detector for motor vehicles; and this ultrasonic sandwich transducer is rugged and cost-effective and, in addition, possesses a high sensitivity in a wide acceptance angle range (greater than 120°). Thus the interior space of a motor vehicle can be monitored using a single ultrasonic sandwich transducer. Deviating from the depicted specific embodiment, it is possible to develop an ultrasonic sandwich transducer whose piezoelectric-ceramic wafer 1 is surrounded on one side only with a layer 2 of low acoustical impedance. Moreover, in place of a rectangular shape for the piezoelectric-ceramic wafer 1, other shapes, such as round shapes or other multi-sided shapes are feasible.

The above mentioned resonant frequencies are calculated according to known laws of physics; that is they depend both on the sonic velocity in the material as well as on the dimensions. As a result of the block-shaped structure, there are three basic resonances including longitudinal resonance, width resonance and thickness resonance. In the case of disk-shaped designs, there are the fundamental modes of thickness vibration and of radial vibration. If one wants to utilize still additional vibrational modes and thus vibrational frequencies, one can use harmonics of the respective vibrations, whose frequencies are a multiple of the fundamental mode.

The application of such an ultrasonic transducer, however, is not limited to detecting glass breakage. The selective tuning of the transducer resonant frequencies is also possible for the spectrum of other ultrasonic emissions which is to be measured. For example, the characteristic emission spectrum of moving machine parts can be analyzed, in order to test these parts for operativeness or wear and tear.

What is claimed is:

1. An ultrasonic sandwich transducer for use in a glass-break signalling configuration comprising a three-dimensional element including:

a) a first layer having a low acoustical impedance;

b) a second layer having a low acoustical impedance;

c) a piezoelectric ceramic wafer disposed between said first and second layers; and d) a dimension having a predetermined length, whereby said predetermined length enables the ultrasonic sandwich transducer to have high receiving sensitivity at a desired bandwidth of frequencies;

wherein said three-dimensional element further comprises a block-shaped member having a height, a length and a width, wherein at least one of said height, length, and width has a dimension chosen to correspond to a desired fundamental frequency; and further comprising a first layer of flexible embedding material, and a second layer of flexible embedding material, said first and second layers of flexible embedding material including filler for damping that is variable in quantity, wherein said first layer of low acoustical impedance has an exterior surface on which said first layer of flexible embedding material is disposed, and said second layer of low acoustical impedance has an exterior layer on which said second layer of flexible embedding material is disposed.

2. The ultrasonic sandwich transducer according to claim 1, wherein said block-shaped member further comprises a narrow longitudinal side and a broad side, and wherein said narrow longitudinal side can be used as a sound-receiving surface.

3. The ultrasonic sandwich transducer according to claim 1, wherein said block-shaped member further comprises a narrow longitudinal side and a broad side, and wherein said broad side can be used as a sound-receiving surface.

4. A glass-break alerting device including the ultrasonic sandwich transducer according to claim 1, said glass-break alerting device further comprising an evaluator comparing a received ultrasonic spectrum to an ultrasonic spectrum that is typical for glass breakage and evaluating the received spectrum.

5. The glass-break alerting device according to claim 4, further comprising a microprocessor for storing an ultrasonic spectrum that is typical for glass breakage.

* * * * *